United States Patent [19]
Tsuji et al.

[11] Patent Number: 5,935,325
[45] Date of Patent: Aug. 10, 1999

[54] APPARATUS FOR MANUFACTURING A SINGLE CRYSTAL

[75] Inventors: Hideki Tsuji; Mitsunori Kawabata; Yoshinobu Hiraishi; Ryo Yamagishi, all of Hiratsuka, Japan

[73] Assignee: Komatsu Electronic Metals, Co., Ltd., Kanagawa, Japan

[21] Appl. No.: 08/874,346

[22] Filed: Jun. 13, 1997

[51] Int. Cl.⁶ .................................................. C34B 35/00
[52] U.S. Cl. .......................... 117/208; 117/200; 117/201; 117/202
[58] Field of Search .................. 117/13, 14, 15, 117/200, 201, 202, 208

[56] References Cited

U.S. PATENT DOCUMENTS

| | | | |
|---|---|---|---|
| 4,794,263 | 12/1988 | Katsuoka et al. | 117/201 |
| 4,915,775 | 4/1990 | Katsuoka et al. | 117/202 |
| 5,378,900 | 1/1995 | Hirano et al. | 117/201 |
| 5,653,799 | 8/1997 | Fuerhoff | 117/201 |
| 5,660,629 | 8/1997 | Shiraishi et al. | 117/201 |
| 5,665,159 | 9/1997 | Fuerhoff | 117/201 |

FOREIGN PATENT DOCUMENTS 63-170296  7/1988  Japan.

*Primary Examiner*—Felisa Hiteshew
*Attorney, Agent, or Firm*—Sughrue, Mion, Zinn, Macpeak & Seas, PLLC

[57] ABSTRACT

A weight control in diameter method by using a load cell is applied to a wire-single crystal silicon pulling mechanism, such that the weight of single crystal silicon can be correctly measured, thereby obtaining superior control in diameter and reducing the cost of manufacturing the single crystal silicon.

4 Claims, 3 Drawing Sheets

APPARATUS FOR MANUFACTURING A SINGLE CRYSTAL

BACKGROUND OF THE INVENTION

1. Field of the Invention

The invention relates to an apparatus for manufacturing single crystal by use of a weighing control in diameter method.

2. Description of Prior Art

The Czochralski (hereafter, CZ) method is one of the methods for manufacturing single crystal in the semiconductor industry. In the CZ method, polysilicon with high purity fed into a quartz crucible is melted into a melt, a seed is dipped into the melt and then the seed stuck in the melt is pulled to form single crystal silicon. FIG. 4 depicts the basic structure of an apparatus for manufacturing single crystals based on the CZ method. A seed 22 supported by a seed holder 21 which is connected to a pulling wire 19 is rolled up by a wire-rolling drum 5, thereby pulling the growing single crystal silicon. In the apparatus for manufacturing single crystal by using the pulling wire 19, the predetermined dimension (diameter) of the single crystal silicon can be controlled by an optical control in diameter method. In the optical control in diameter method, a meniscus ring on the interface 24 of the melt and single crystal silicon (not shown) is recorded by a camera 23, wherein the generated video signals are fed into a width-calculating unit 26, thereby calculating the diameter of the single crystal silicon located at the meniscus ring, and a monitor 28 from a camera control unit 25. Then the diameter of the single crystal silicon can be controlled at a predetermined value based on calculated pulling speed signals 29 and estimated melting temperature signals 30 for controlling the diameter of the single crystal silicon by the diameter control device 27.

As another control method based on the CZ, a weighing control in diameter method, is well known. In the weighing control in diameter method, the weight of the growing single crystal silicon measured by a load cell is compared with a standard crystal weight set by the diameter control device. Based on the difference between the weight measured by the weighing control in diameter method and the standard crystal weight, the pulling speed and melting temperature are adjusted, thereby keeping the diameter of the single crystal silicon approximately equal to the diameter of the standard crystal. In this method, since the weight of the growing single crystal silicon must be accurately measured, a special apparatus for manufacturing single crystal silicon is utilized. This apparatus can directly measure the weight of the single crystal silicon by suspending the seed at a loading point of a load cell via a force bar The weighing control in diameter method has superior diameter control characteristics to those of the optical control in diameter method. Particularly, it has excellent reproduction of absolute value in diameter and controllability of a formed tail (i.e., the reduction in the diameter of the tail portion of the single crystal silicon during growing can be performed). However, since a force bar is used in the weighing control in diameter method while a pulling wire is employed in the optical control in diameter method, when manufacturing the same length of the single crystal silicon by the weighing control in diameter method, the manufacturing apparatus must be twice as high as that required for the optical control in diameter method. As a result, the weighing control in diameter apparatus occupies more space than that of the optical control in diameter apparatus. Furthermore, the cost of the apparatus for the former method is greater than that for the latter. To resolve the above-mentioned problem, it is necessary to apply the weighing control in diameter method to a typical apparatus by using a pulling wire to pull the single crystal silicon.

As briefly shown in FIG. 5, in an apparatus for manufacturing single crystal silicon 33 by using a pulling wire, the structure for measuring the weight of the single crystal silicon comprises a guide pulley 32 disposed above a wire-rolling drum 31, wherein the weight of the single crystal silicon is applied on the guide pulley 32 via a pulling wire 35 and a load cell 34 for measuring the weight of the single crystal silicon. However, the precise weight of the single crystal silicon required by the weighing control in diameter method can not be measured by this structure. The reason why it is not possible to measure the weight of the single crystal silicon precisely will be described in the following. Since the flexible pulling wire 35 is formed by twisting filaments, the diameter of the pulling wire 35 is not a constant. Therefore, when using this structure shown in FIG. 5 to measure the weight of the single crystal silicon, the distance between the center point on the guide pulley 32 and the cross-sectional center point of the pulling wire 35 (i.e., the point on which the weight of the single crystal silicon is applied) is defendant on the diameter direction of the guide pulley 32. Due to this variability, the load center of the guide pulley 32 also varies. Consequently, the balance point of a force applied to the guide pulley 32 departs from the load applied on the load cell 34, making it impossible to weigh the single crystal silicon accurately. Due to this phenomena caused by the variations in diameter of the pulley wire 35, the measured weight of the load cell 34 varies periodically, depending on the twisting pitch of the pulling wire 35 and the rolling speed of the wire-pulling drum 31, even though there is in fact no variation in the weight of the single crystal silicon. With such an error in the weight of the single crystal silicon measured by the load cell, the diameter of the single crystal silicon can not be controlled stably and the high quality single crystal silicon can not be obtained.

SUMMARY OF THE INVENTION

In view of the above, the object of the invention is to provide a low cost apparatus for manufacturing single crystal. This apparatus has a structure of pulling single crystal silicon by a pulling wire, wherein the diameter of the single crystal silicon can be precisely controlled by a weighing control in diameter method.

In order to accomplishing the above object, the apparatus for manufacturing single crystal according to the invention comprises a pulling wire for pulling the single crystal silicon, a wire-rolling member for rolling the pulling wire, and a rotating mechanism to rotate the wire-rolling member on the center line of the single crystal silicon, characterized in having a structure for supporting the wire-rolling member by a load cell, wherein the wire-rolling member and load cell are all disposed in a vacuum chamber.

In the above-mentioned apparatus, a stepping motor is utilized to drive the wire-rolling member. Based on the instruction signal of a weighing control in diameter device, the divided number of the step phase of the stepping motor is switched, thereby switching control speed regions.

Moreover, a synchronous mass moving member moves in a direction opposite to the moving direction of the wire-rolling member, thereby counteracting the bias load caused by the movement of wire-rolling member during single crystal pulling.

In addition, the mass of the required mass moving member can be reduced by making the moving pitch of the mass moving member greater than that of the wire-rolling drum.

According to the invention, the diameter of the single crystal silicon can be precisely controlled by a weighing control in diameter device (i.e., a load cell) mounted in a conventional apparatus. Based on the above-mentioned method, since the entire wire-rolling mechanism for pulling the single crystal silicon is mounted on the load cell, the load created by the wire-rolling mechanism and the growing single crystal silicon during the single crystal pulling is totally applied on the load cell. Therefore, the weight variation of the single crystal silicon can be accurately measured such that highly precise weighing control in diameter can be obtained.

Furthermore, since a stepping motor is used for driving the wire-rolling member and the divided number of the step phase of the stepping motor is switched by a motor amplifier, the stepping motor can rotate with precision and stability by reducing the electrical step phase by controlling it so as to be able to pull the single crystal silicon at a low speed. Under different conditions, in order to increase the operating rate of the apparatus for manufacturing the single crystal, the electrical step phase can be increased by controlling it, wherein the stepping motor rotates at a high speed with the same oscillation frequency as at a low speed. Hence, the pulling speed can be controlled over a wide range by the stepping motor.

When pulling the single crystal silicon, in order to prevent the pulling wire from overlapping on the wire-rolling drum, the wire-rolling drum must rotate and move in an axial direction simultaneously. With the moving of the wire-rolling drum, the bias load (i.e., the product of the weight of the wire-rolling drum and the displacement of its center of gravity) is applied on the load cell. Accordingly, a mass moving member, which moves synchronously with the rotation of the wire-rolling drum and has the same mass as the wire-rolling drum, is mounted, wherein the moving direction of the mass moving-device is opposite to that of the wire-rolling drum. Therefore, any variation in the center of gravity of the mechanism disposed on the load cell, resulting from the moving of the wire-rolling drum can be prevented, once the bias load momentum is counteracted by the momentum created by the mass moving member. As a result, the weight of the single crystal silicon can be measured precisely by the load cell.

Furthermore, the mass of the mass moving member used for counteracting the bias load caused by the moving of the wire-rolling drum can be reduced by making the moving pitch of the mass moving member greater than that of the wire-rolling drum.

DETAILED DESCRIPTION OF THE INVENTION

Figure 1:
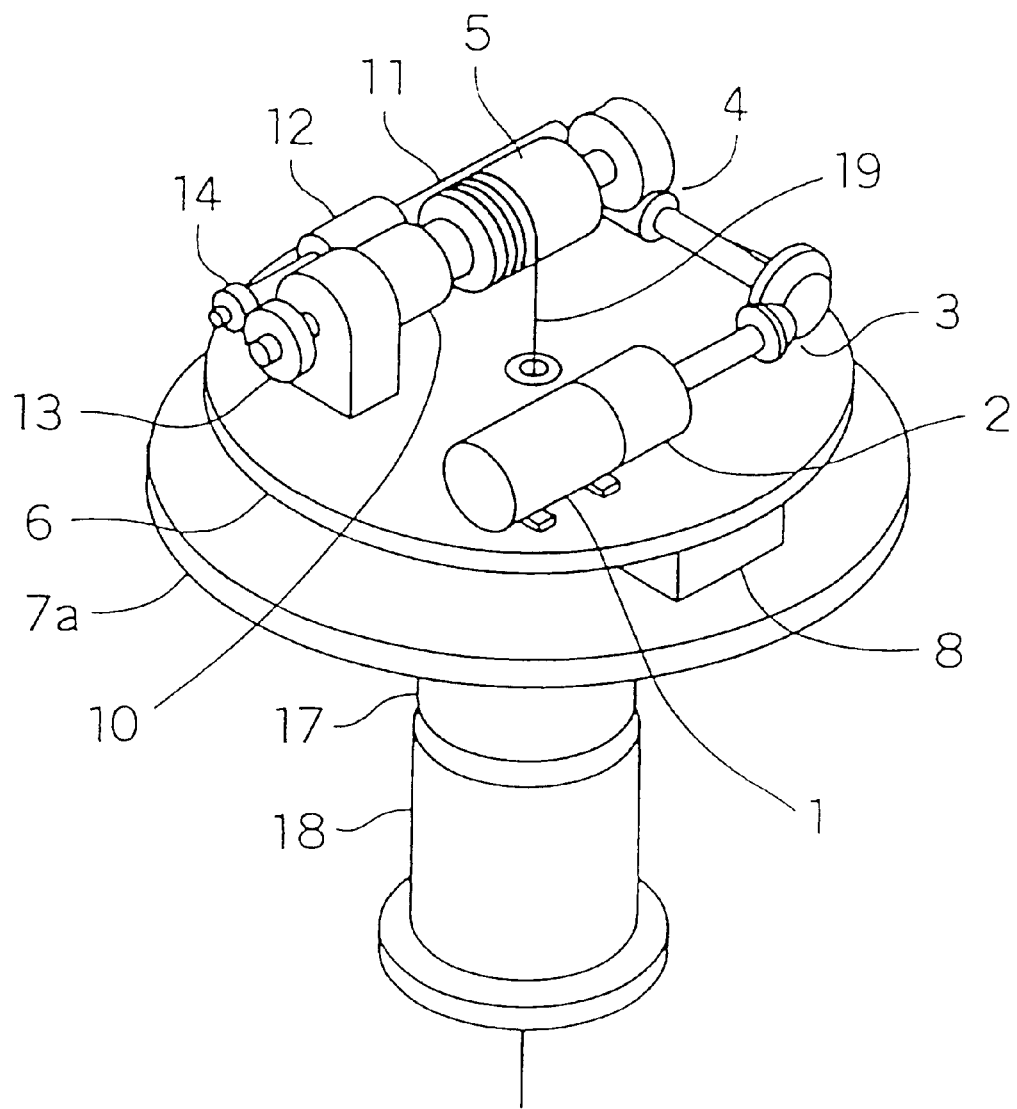
FIG. 1 is a perspective view illustrating the driving system of a wire-rolling mechanism in an apparatus for manufacturing single crystal silicon.
Figure 2:
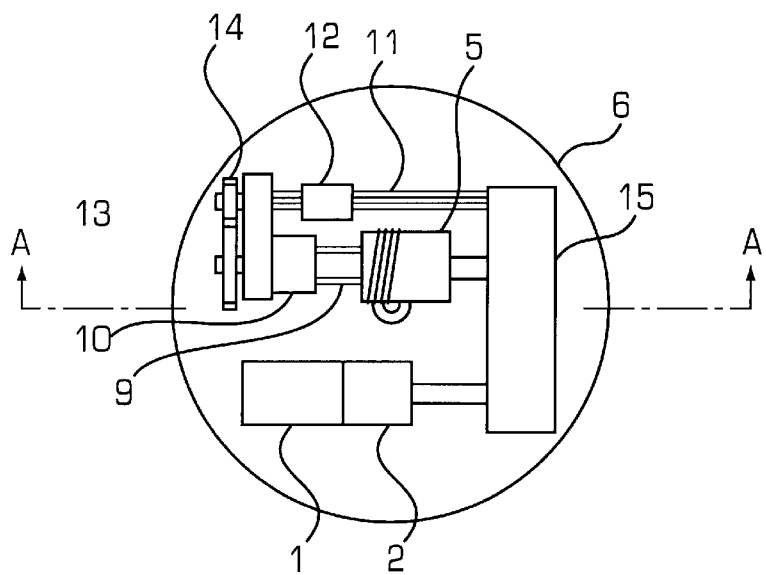
FIG. 2 is a top view showing the wire-rolling mechanism of FIG. 1.
Figure 3:
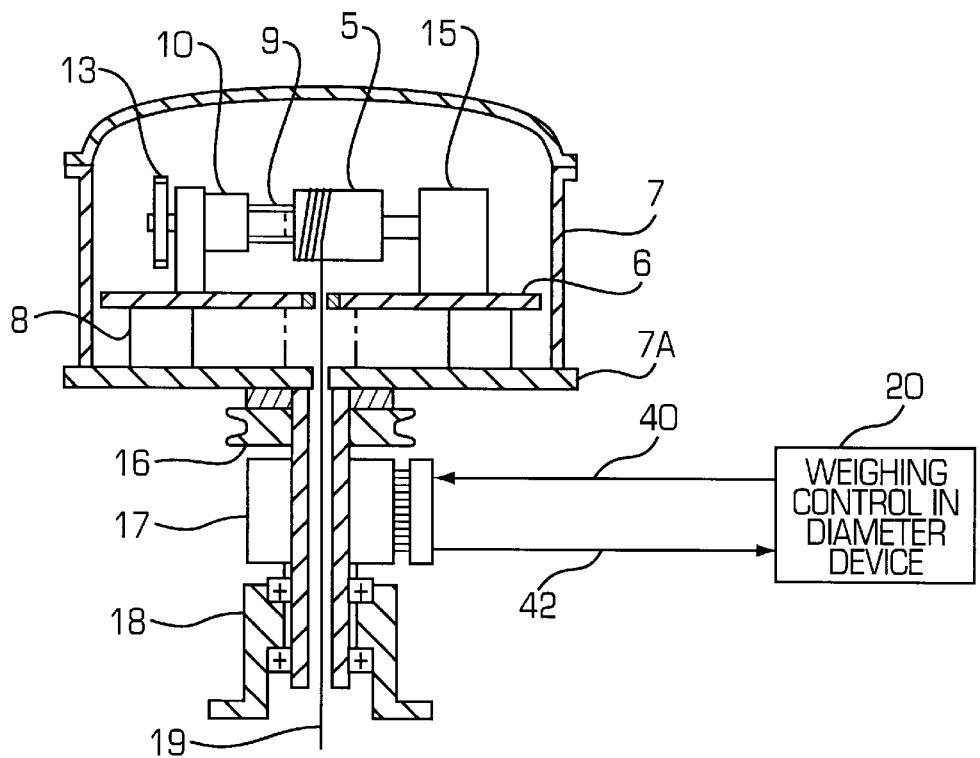
FIG. 3 is a cross-sectional view along line A—A of FIG. 2.
Figure 4:
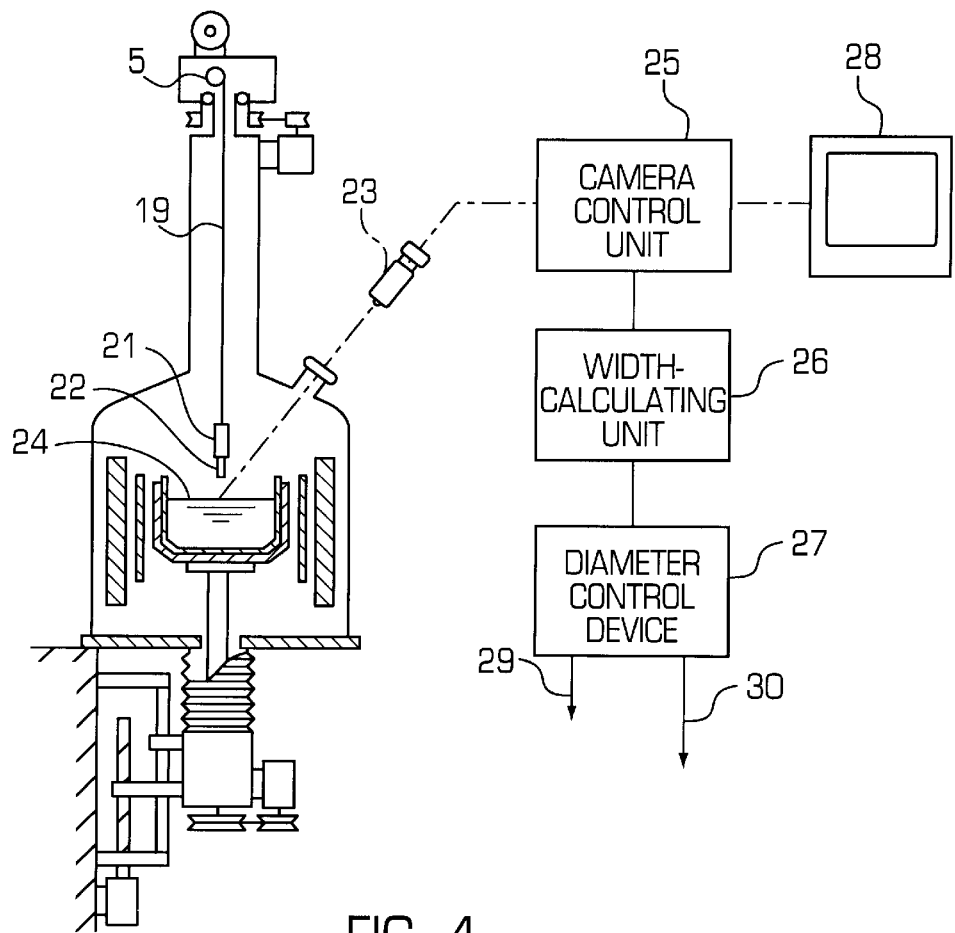
FIG. 4 is schematic view showing the brief structure of a conventional apparatus for manufacturing single crystal silicon by an optical control in diameter method.
Figure 5:
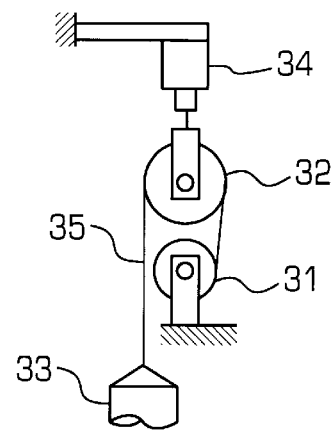
FIG. 5 is a schematic view showing a conventional load cell mounted on a wire-single crystal pulling mechanism.

Next, an apparatus for manufacturing single crystal silicon according to an embodiment of the invention will be described with reference to the pertinent drawings. FIG. 1 is a perspective view illustrating the driving system of a wire-rolling mechanism in an apparatus of manufacturing single crystal silicon. FIG. 2 is a top view showing the wire-rolling mechanism. FIG. 3 is a cross-sectional view along the line A—A of FIG. 2. In those drawings, the wire-rolling mechanism includes a stepping motor 1, a reducer 2, 3, and 4, and a wire-rolling drum 5 which are all mounted on a plate 6 in a vacuum environment. As shown in FIG. 3, load cells 8 are disposed on the bottom plate 7a of a vacuum chamber 7 and the plate 6 is mounted on the load cells 8. As shown in FIG. 3, three load cells 8 are disposed on the bottom plate 7a, spaced apart with a pitch of 120°, thereby together sharing and measuring the load of the wire-rolling mechanism and the plate 6.

There is a thread portion on the drum shaft 9, wherein the pitch of the thread is the same as that of wire-rolling ditches on the wire-rolling drum 5. The drum shaft 9 is threaded into the nut located inside a drum support 10. Moreover, a removable deadweight 12 is mounted by a ball screw 11 and splines (not shown) parallel to the drum shaft 9. The ball screw 11 is rotated by a synchronous driven gear 14 engaging with a synchronous driving gear 13 located on the end of the drum shaft 9. In FIGS. 1 and 2, the ball screw 11 is mounted beside the drum shaft 9, but the ball screw 11 may be also mounted under the drum shaft 9. As shown in FIG. 1, the reducer 2, 3 and 4 is contained inside the gear box 15.

In addition, a pulley 16, slip ring 17 and magnetic seal 18 for rotating the vacuum chamber 7 are disposed under the vacuum chamber 7, wherein a pull chamber (not shown) is mounted under the magnetic seal 18. When the pulley 16 is driven by a belt (not shown) to rotate the vacuum chamber 7, a pulling wire 19 rolls up single crystal silicon (not shown).

The instruction signal 40 from a weighing control in diameter device 20 mounted outside the apparatus of manufacturing single crystal silicon drives the stepping motor 1 disposed in the vacuum chamber 7 using the slip ring 17. Then, the stepping motor 1 can rotate the wire-rolling drum 5 using the reducer 2, 3, and 4. Since the wire-rolling drum 5 rotates and moves along the nuts located on the drum support 10 simultaneously, the position of the pulling wire can remain on a predetermined position.

Furthermore, since the wire-rolling mechanism is disposed on the load cells 8, wherein the weight of the wire-rolling mechanism is taken as a known initial value, the weight variation of the growing single crystal silicon can be precisely measured by the load cell 8. Next, the measured weight signal 42 from the load cell 8 is fed to the weighing control in diameter device 20 via the slip ring 17. After that, an instruction signal 40 for adjusting wire-rolling speed and melting temperature is emitted from the weighing control in diameter device 20 based on the weight variation of the single crystal silicon.

However, since the wire-rolling mechanism is placed on the load cell 8, in order to ensure that the load cell 8 has a wide weighing range, it is necessary to reduce the weight of the wire-rolling mechanism. Furthermore, the wire-rolling mechanism should not only be capable of a general pulling speed of 0–5 mm/min., but also capable of a high rolling up speed of 600 mm/min for increasing the operating rate after the single crystal silicon is grown completely. Generally, the wire-rolling mechanism is constructed by a reducing mechanism that includes two motors and a clutch. In the embodiment, in order to obtain the required rolling up speed using a light wire-rolling mechanism, the above-mentioned reducing mechanism utilizes just one stepping motor. Furthermore, for attaining a wide range of rolling up speeds just using one control system, the microstep method is adopted. In this method, the stepping motor is driven in a general divided number of step phase while rotating at a high speed, while the stepping motor is driven in a large divided number of step phase while rotating at a low speed. Based on the different speed regions to switch the divided number of the step phase, the stepping motor can rotate at a high speed or low speed with the same oscillation frequency.

In the operation, the weight of the single crystal silicon on the load cell 8 is varied and the wire-rolling drum 5 is moving. With the moving of the wire-rolling drum 5, the deadweight 12 serving as the mass moving member moves in the direction opposite to the moving direction of the wire-rolling drum 5, thereby counteracting any variation in the load center on the load cell 8 caused by the moving of the wire-rolling drum 5. Consequently, the varying weight of the single crystal silicon can be further precisely measured by the load cell 8.

As described above, since the wire-rolling mechanism is mounted on the load cell 8, the measuring range of the load cell 8 is limited. That is to say the weight of the single crystal silicon which can be measured is limited by the weight of the wire-rolling mechanism. Consequently, a light wire-rolling mechanism is needed. For this purpose, in the mass moving mechanism for preventing load bias resulting from the weight of the wire-rolling drum 5 and the moving of the wire-rolling drum 5, the movement distance of the deadweight 12 having a weight ½ times the weight of the wire-rolling drum 5 is twice the displacement of the wire-rolling drum 5, thereby reducing the load applied on the load cell 8.

The above-recited single crystal pulling mechanism mounted on the conventional apparatus of manufacturing the single crystal silicon combines the weighing control in diameter device used by the force bar-apparatus for manufacturing the single crystal silicon with the wire-apparatus for manufacturing the single crystal silicon. As a result, like the conventional force bar-apparatus for manufacturing the single crystal silicon, precise diameter control can be obtained.

According to the invention, since the entire wire-rolling mechanism is mounted on the load cell in the wire-apparatus of manufacturing the single crystal silicon, the weight of the single crystal silicon and the known weight of the wire-rolling mechanism are applied on the load cell by which the precise weight of the single crystal silicon can be measured. In summary, since the load cell and weighing control in diameter device of force bar-apparatus of manufacturing the single crystal silicon are mounted on the wire-apparatus of manufacturing the single crystal silicon, and the cost for constructing wire-apparatus of manufacturing the single crystal silicon is less than that of the force bar-apparatus, the apparatus according to the invention has the advantages of superior control in diameter and low cost.

What is claimed is:

1. An apparatus for manufacturing a single crystal comprising:

a pulling wire for pulling a single crystal silicon;

a wire-rolling mechanism for rolling up the pulling wire;

a rotating mechanism for rotating the wire-rolling mechanism on the center line of the single crystal silicon; and a load cell for supporting the wire-rolling mechanism and for detecting a weight of the wire-rolling mechanism loaded with a weight of the single crystal silicon, wherein the wire-rolling mechanism and the load cell are disposed in a vacuum chamber.

2. The apparatus as claimed in claim 1, wherein the wire-rolling mechanism is driven by a stepping motor and divided number of step phase of the stepping motor is switched by instruction signals of a weighing control in diameter device, thereby switching the stepping motor between a high speed and a low speed.

3. The apparatus as claimed in claim 1, wherein the apparatus comprises a mass moving member driven synchronously with the rotation of a wire-rolling drum which moves in a direction opposite to the moving direction of the wire-rolling drum, thereby counteracting a bias load caused by the moving of the wire-rolling drum during pulling up the single crystal silicon.

4. The apparatus as claimed in claim 3, wherein a moving pitch of the mass moving member is greater than that of the wire-rolling drum in order to reduce the required mass of the mass moving member.

\* \* \* \* \*